US006613494B2

(12) United States Patent
Savariar-Hauck et al.

(10) Patent No.: US 6,613,494 B2
(45) Date of Patent: Sep. 2, 2003

(54) IMAGEABLE ELEMENT HAVING A PROTECTIVE OVERLAYER

(75) Inventors: Celin Savariar-Hauck, Badenhausen (DE); Gerhard Hauck, Badenhausen (DE); Dietmar Frank, Osterode (DE); Ulrich Fiebag, Nienstadt (DE)

(73) Assignee: Kodak Polychrome Graphics LLC, Norwalk, CT (US)

(*) Notice: Subject to any disclaimer, the term of this patent is extended or adjusted under 35 U.S.C. 154(b) by 132 days.

(21) Appl. No.: 09/805,327

(22) Filed: Mar. 13, 2001

(65) Prior Publication Data

US 2002/0187425 A1 Dec. 12, 2002

(51) Int. Cl.$^7$ .............................. G03F 7/11; G03F 7/16

(52) U.S. Cl. .................... 430/272.1; 430/162; 430/155; 430/273.1; 430/165; 101/456; 101/457

(58) Field of Search ................................ 430/162, 155, 430/272.1, 273.1, 165; 101/456, 457

(56) References Cited

U.S. PATENT DOCUMENTS

| | | | | | |
|---|---|---|---|---|---|
| 4,725,526 | A | * | 2/1988 | Frass et al. | 430/162 |
| 5,326,675 | A | * | 7/1994 | Niki et al. | 430/273.1 |
| 6,083,663 | A | | 7/2000 | Vermeersch et al. | 430/302 |

FOREIGN PATENT DOCUMENTS

| | | | |
|---|---|---|---|
| EP | 0908779 A1 | 4/1999 | G03F/7/09 |
| EP | 0950513 A1 | 10/1999 | B41C/1/10 |
| EP | 0950518 A1 | 10/1999 | B41C/1/10 |
| WO | WO 98/19219 | 5/1998 | G03F/7/1075 |
| WO | WO 99/21725 | 5/1999 | G03F/7/075 |

* cited by examiner

*Primary Examiner*—Cynthia Hamilton
(74) *Attorney, Agent, or Firm*—RatnerPrestia

(57) ABSTRACT

Positive-working imageable elements and methods for their preparation are disclosed. The elements comprise a hydrophilic substrate; a bottom layer, which contains a positive-working photosensitive composition; and a protective overlayer, which has an overlayer material that reduces the solubility of the photosensitive composition in an aqueous alkaline developer. The overlayer may be conveniently applied by a dip and rinse procedure.

28 Claims, No Drawings

IMAGEABLE ELEMENT HAVING A PROTECTIVE OVERLAYER

FIELD OF THE INVENTION

This invention relates to lithographic printing. In particular, this invention relates to imageable elements having a protective overlayer and to methods for their preparation.

BACKGROUND OF THE INVENTION

In lithographic printing, ink receptive areas, known as image areas, are generated on a hydrophilic surface. When the surface is moistened with water and ink is applied, the hydrophilic regions retain the water and repel the ink, and the ink receptive areas accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Lithographic printing plates, sometimes called printing plate precursors or printing forms, typically comprise a radiation-sensitive layer applied over the surface of a hydrophilic support. The radiation-sensitive layer includes one or more radiation-sensitive components, which may be dispersed in a suitable binder. Alternatively, the radiation-sensitive component can also be the binder material.

To obtain a printing plate with imagewise distribution of printable areas, it is necessary to remove areas of an imaged printing plate. The most common method for removing the undesired areas is to contact the imaged plate with a developer solution. If after exposure to radiation the exposed regions of the layer are removed by the developer revealing the underlying hydrophilic surface of the support, the plate is a positive-working printing plate. Conversely, if the unexposed regions are removed, the plate is a negative-working plate. In each instance, the regions of the radiation-sensitive layer (i.e., the image areas) that remain after development are ink-receptive, and the regions of the hydrophilic surface revealed by the developing process accept water and aqueous solutions, typically a fountain solution, and repel ink.

Many alkaline-developable positive-working printing plates have a light sensitive layer comprising a novolac resin and a radiation-sensitive o-diazoquinone or diazonaphthoquinone compound, such as a naphthoquinonediazide sulfonic acid ester of a novolac resin. Upon exposure to light, the radiation-sensitive diazonaphthoquinone is converted to the corresponding carboxylic acid. The alkaline developer removes only the exposed regions of the radiation-sensitive layer, revealing the underlying hydrophilic surface of the support.

The amount of diazonaphthoquinone compound in a radiation-sensitive layer determines its photospeed. Diazonaphthoquinone inhibits attack by the developer. When more diazonaphthoquinone is present in the layer, more radiation is required to covert the diazonaphthoquinone to alkali soluble acid. Thus, photospeed can be increased by decreasing the amount of diazonaphthoquinone in the layer.

However, reducing the amount of diazonaphthoquinone compound in the layer also reduces the resistance of the unimaged regions to attack by the developer. Consequently, photospeed cannot be increased by reducing the amount of diazonaphthoquinone in the radiation-sensitive layer without reducing the resistance of the unimaged regions to developers.

Developer resistance can be enhanced by heating the unexposed printing plate in an oven for a prolonged period of time. Because printers require printing plates with consistent properties, this is generally done by the manufacturer, increasing the cost of manufacture of the printing plates.

Developer resistance can also be enhanced by applying a developer-resistant top layer over the radiation-sensitive layer. Van Damme, EP 0 950 518, discloses a two-layer heat mode imaging element in which the top layer comprises an infra-red dye or pigment, a binder resin, and a surfactant. However, the material added to the top layer must be soluble in the solvent used to apply the top layer. In addition, the material used in this layer sometimes tends to form insoluble residues in the developer bath. The throughput for the developer is reduced, and the bath may require extensive cleaning to remove the residues.

Thus, a need exists for a printing plate that has improved photospeed but in which the unexposed regions are resistant to alkaline developers and do not require a prolonged conditioning step as part of the manufacturing process. In addition, undesirable residues should be formed in the developer bath.

SUMMARY OF THE INVENTION

In one aspect, the invention is a method for preparing a positive working imageable element, the element comprising, in order:

a hydrophilic substrate;

a bottom layer; and an overlayer comprising an overlayer material; the method comprising:

applying the overlayer over the bottom layer of a precursor comprising the bottom layer and the hydrophilic substrate, and forming the imageable element;

in which:

the overlayer is applied from a solution of the overlayer material in a solvent;

the bottom layer comprises a positive working photosensitive composition;

the positive working photosensitive composition comprises a phenolic resin;

the overlayer material reduces the alkali solubility of the phenolic resin;

the bottom layer is essentially insoluble in the solvent; and the overlayer is less than about 0.01 $\mu$m thick.

In one embodiment, the overlayer is applied by dipping or immersing the precursor in a solution comprising the overlayer material and the solvent. In another embodiment, a solution of the overlayer material is applied to, or coated over, the bottom layer.

In another aspect, the invention is the imageable element. In one embodiment, the overlayer consists essentially of the overlayer material.

DETAILED DESCRIPTION OF THE INVENTION

Hydrophilic Substrate

The hydrophilic substrate, i.e., a substrate that comprises at least one hydrophilic surface, comprises a support, which may be any material conventionally used to prepare lithographic printing plates. The support is preferably strong, stable and flexible. It should resist dimensional change under conditions of use so that color records will register in a full-color image. Typically, it can be any self-supporting material, including polymeric films, ceramics, metals, or stiff papers, or a lamination of any of these materials. Paper supports are typically "saturated" with a polymeric material to impart water resistance, dimensional stability, and strength.

Metal supports include aluminum, zinc, titanium, and alloys thereof. A preferred metal support is an aluminum sheet. To produce the hydrophilic surface, the surface of the aluminum sheet may be treated by techniques well known in the art. These include, for example, physical graining, electrochemical graining, chemical graining, and anodizing, followed by chemical conditioning, for example by treatment with water, a solution of phosphate or silicate salt, or a polycarboxylic acid. Roughened substrates in which the surface has a surface roughness of 0.1 μm to 2 μm are disclosed in Bhambra, U.S. Pat. No. 6,105,500; WO98/52769; and WO98/01496.

Useful polymeric films include polyester films (such as MYLAR® polyethylene terephthalate film sold by E.I. du Pont de Nemours and Co., Wilmington, Del.) and polyethylene naphthanate. A preferred polymeric film is polyethylene terephthalate.

The substrate may consist only of the support, or it may additionally comprise one or more optional subbing and/or adhesion layers. Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequently applied layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The back side of the substrate (i.e., the side opposite the bottom layer and overlayer) may be coated with an antistatic agent and/or a slipping layer or matte layer to improve handling and "feel" of the imageable element.

The support should be of sufficient thickness to sustain the wear from printing and be thin enough to wrap around a printing press. Polyethylene terephthalate or polyethylene naphthanate, typically has a thickness of from about 100 μm to about 310 μm, preferably about 175 μm. Aluminum sheet typically has a thickness of from about 100 μm to about 600 μm.

Bottom Layer

The bottom layer, or imageable layer, comprises a positive-working composition. The bottom layer may be a conventional analog layer, i.e. a layer that is imageable by visible, typically short wavelength visible, and/or ultraviolet radiation. Alternatively, the bottom layer may be a digital layer, i.e. a layer that is imageable by heat and/or by infrared and/or near infrared radiation. After imaging, the imaged regions of the layer are removed in a developing process.

Positive-working Analog Layers

Analog layers that comprise imageable positive-working photosensitive compositions are well known. They are discussed, for example, in Chapter 5 of *Photoreactive Polymers: the Science and Technology of Resists,* A. Reiser, Wiley, New York, 1989, pp. 178–225. These compositions comprise a binder and a material that comprises a photosensitive moiety. The photosensitive moiety may be bonded to the binder and/or be present in a separate compound.

The binder comprises a phenolic resin, such as a novolac resin. Novolac resins are commercially available and are well known. They are typically prepared by the condensation reaction of a phenol, such as phenol, m-cresol, o-cresol, p-cresol, etc., with an aldehyde, such as formaldehyde, para-formaldehyde, acetaldehyde, etc. or ketone, such as acetone, in the presence of an acid catalyst. The weight average molecular weight is typically about 1,000 to 15,000. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

Other phenolic resins include polyvinyl compounds having phenolic hydroxyl groups. Such compounds include, for example, resole resins, polymers of hydroxystyrene (vinyl phenol), such as poly(p-hydroxystyrene); copolymers containing recurring units of hydroxystyrene; and polymers and copolymers containing recurring units of substituted hydroxystyrenes, such as acrylate and methacrylate copolymers of hydroxystyrene.

The photosensitive moiety is typically the o-diazonaphthoquinone moiety. Compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone. Preferred reactive compounds are the sulfonyl chloride or esters; the sulfonyl chlorides are most preferred.

Useful compounds include, but are not limited to: 2,4-bis-(2-diazo-1,2-dihydro-1-oxo-5-naphthalenesulfonyloxy)benzophenone; 2-diazo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis-(2-diazo-1,2-dihydro-1-oxo-5-naphthalenesulfonyloxy)biphenyl; 2,2',4,4'-tetrakis(2-diazo-1,2-dihydro-1-oxo-5-naphthalenesulfonyloxy)biphenyl; 2,3,4-tris(2-diazo-1,2-dihydro-1-oxo-5-naphthalenesulfonyloxy)benzophenone; 2,4-bis(2-diazo-1,2-di-hydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2', 4,4'-tetrakis(2-diazo-1,2-dihydro-1-oxo-4-naphthalenesulfonyloxy)biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816.

The phenolic resin may be derivatized with an o-diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322. An example of a resin derivatized with a compound that comprises a diazonaphthoquinone moiety is P-3000, a naphthoquinone diazide of a pyrogallol/acetone resin (available from PCAS, France).

Positive-working Thermally Imageable Compositions

The imageable compositions used in these layers comprise a binder, a dissolution inhibitor, and optionally, a photothermal conversion material. Such systems are disclosed in, for example, Parsons, WO 97/39894; Nagasaka, EP 0 823 327; Miyake, EP 0 909 627; West, WO 98/42507; and Nguyen, WO 99/11458, all of which are incorporated herein by reference. The binder is typically a phenolic resin, such as a novolac resin, as discussed above. The dissolution inhibitors are believed not to be sensitive, i.e. photoreactive, themselves to radiation in the range of about 600 nm to about 800 nm and radiation in the range of about 800 nm to about 1200 nm, the radiation typically used to image a thermally imageable element.

The dissolution inhibitor may be a compound that comprises an o-diazonaphthoquinone moiety, such as is discussed above. The derivatized resins that comprise an o-diazonaphthoquinone moiety can act as both the binder and the dissolution inhibitor. They can be used alone, or they can be combined with other binders and/or dissolution inhibitors.

Other compounds useful as dissolution inhibitors include, compounds that contain a positively charged (i.e., quaternized) nitrogen atom, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide; tetraethyl ammonium bromide; tetrapropyl ammonium chloride; and trimethylalkyl ammonium chlorides and trimethylalkyl ammonium bromides, such as trimethyloctyl ammonium bromide and trimethyldecyl ammonium chloride. Representative triarylmethane dyes dissolution inhibitor compounds include ethyl violet, crystal violet, malachite green, brilliant green, Victoria blue B, Victoria blue R, and Victoria pure blue BO.

Quaternized heterocyclic compounds are useful as dissolution inhibitors. Representative imidazolium compounds include Monazoline C, Monazoline O, Monazoline CY, and Monazoline T, all of which are manufactured by Mona Industries. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl -1-(propenyl) benzothiazolium cationic dyes and 3-ethyl-2-methyl benzothiazolium iodide. Suitable pyridinium dissolution inhibitor compounds include cetyl pyridinium bromide and ethyl viologen dications.

Diazonium salts are useful as dissolution inhibitor compounds and include, for example, substituted and unsubstituted diphenylamine diazonium salts, such as methoxy-substituted diphenylamine diazonium hexafluoroborates. These compounds are particularly useful in non-preheat plates.

Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenyl amine and triphenyl amine.

Keto containing compounds useful as dissolution inhibitor compounds include, for example, aldehydes; ketones, especially aromatic ketones; and carboxylic acid esters. Representative aromatic ketones include xanthone, flavanone, flavone, 2,3-di-phenyl-1-indenone, 1'-(2'-acetonaphthonyl)benzoate, (α- and β-naphthoflavone, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

A preferred group of dissolution inhibitor compounds includes those that are also dyes, especially triarylmethane dyes such as ethyl violet. These compounds can also act as contrast dyes, which distinguishes the unimaged regions from the imaged regions in the developed imageable element.

When a dissolution inhibitor compound is present, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the binder itself can comprise polar groups that act as acceptor sites for hydrogen bonding with the hydroxy groups present in the polymeric material and, thus, act as a dissolution inhibitor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

Derivatization of the hydroxyl groups of the binder increases its molecular weight and reduces the number of hydroxyl groups, typically reducing both its solubility and rate of dissolution in the developer. Although it is important that the level of derivatization be high enough that the binder also acts as a dissolution inhibitor, it should not be so high that, following thermal imaging the binder is not soluble in the developer. Although the degree of derivatization required will depend on the nature of the binder and the nature of the moiety containing the polar groups introduced into the binder, typically about 0.5 mol % to about 5 mol %, preferably about 1 mol % to about 3 mol %, of the hydroxyl groups will be derivatized. These derivatized binders can be used either alone or in combination with other polymeric materials and/or dissolution inhibitors.

One preferred group of binders that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried by reaction of the polymeric material with, for example a sulfonyl chloride such as p-toluene sulfonyl chloride, in the presence of a base such as a tertiary amine. A preferred derivatized binder is a derivatized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

It will be appreciated that although phenolic polymers which have been derivatized with polar groups (e.g., polymers in which some of the hydroxyl groups have been derivatized with sulfonic acid ester groups or with groups that contain the diazonaphthoquinone moiety) are soluble in aqueous alkaline developer, a layer comprising or consisting essentially of one or more of these materials is "insoluble" in aqueous alkaline developer. This is because solubility and insolubility of the layer are determined by the relative rates at which the imaged and unimaged regions of the layer are removed by the developer. Following imagewise thermal exposure of a layer comprising or consisting essentially of one or more of these derivatized phenolic polymeric materials, the exposed regions of the layer are removed by the aqueous alkaline developer more rapidly than the unexposed regions. If the development step is carried out for an appropriate time, the exposed regions are removed and the unexposed regions remain, so that an image made up of the unexposed regions is formed. Hence the exposed regions are "removable" or "soluble" in the aqueous developer and the unexposed regions are "not removable" or "insoluble" in the aqueous alkaline developer.

When a photothermal conversion material is present, it may comprise infrared absorber or dye bound to a phenolic material (i.e., a phenolic material derivatized with an infrared absorber or infrared absorbing dye). If an appropriate infrared absorber or dye is selected, the derivatized polymeric material can act as the binder, the dissolution inhibitor, and/or the photothermal conversion material.

The layer may also comprise dye to aid in the visual inspection of the exposed and/or developed element. Printout dyes are added to distinguish the exposed regions from the unexposed regions before and during processing. Contrast dyes are added to distinguish the unimaged regions from the imaged regions in the developed element.

The overlayer may also comprise a cellulose polymer or polymers to improve the resistance of the layer to blanket washes with, for example, petroleum ethers, glycols, glycol ethers, and branched alkanols, for example iso-propyl alcohol and 1-methoxypropan-2-ol. Preferably, the overlayer comprises a carboxylic acid containing cellulose polymer, such as cellulose acetate phthalate, cellulose acetate hydrogen phthalate, and/or cellulose acetate trimellitate. Typically the cellulose polymer comprises 0.1% to 50% by weight, preferably 5% to 20% by weight, and more preferably 8% to 12% by weight of the overlayer. The acid number for the cellulose polymer is typically 50–210, preferably 100–180.

The layer may comprise particulate material to improve both the scratch resistance and presslife of the exposed and developed element. Typically, the particles have an average diameter about 0.5 μm and about 10 μm. organic and/or inorganic particulate material may be used. Examples of organic particles are crosslinked polystyrene beads and polymethyl methacrylate beads. Non-crosslinked polymers such as polycarbonate and acrylonitrile-butadiene copolymers, which form particles in situ during the drying process, are also useful in improving presslife of the exposed and developed elements. Inorganic particles include, for example, silica and alumina particles. The amounts of particles used can range from 0.5% to 30% of the weight of the layer, preferably is 5% to 15%.

If the radiation sensitive element is to be exposed with infrared or near infrared radiation, the bottom layer absorbs radiation, preferably radiation in the range of about 800 nm to 1200 nm. This range of radiation is commonly used for imaging thermally imageable elements. An absorber called a photothermal conversion material is present in the bottom layer. Photothermal conversion materials absorb radiation and convert it to heat. Photothermal conversion materials may absorb ultraviolet, visible, and/or infrared radiation and convert it to heat. Although the binder may itself comprise an absorbing moiety, i.e., be a photothermal conversion material, typically the photothermal conversion material is a separate compound.

The photothermal conversion material may be either a dye or pigment, such as a dye or pigment of the squarylium, merocyanine, indolizine, pyriylium, or metal diothiolene class. Examples of absorbing pigments are Projet 900, Projet 860, and Projet 830 (all available from the Zeneca Corp.). Carbon black pigments may also be used. Because of their wide absorption bands, carbon black-based plates can be used with multiple infrared imaging devices having a wide range of peak emission wavelengths.

Dyes, especially dyes that are soluble in the aqueous alkaline developer, are preferred to prevent sludging of the developer by insoluble material. The dye may be chosen, for example, from indoaniline dyes, oxonol dyes, porphyrin derivatives, anthraquinone dyes, merostyryl dyes, pyriylium compounds, and squarylium derivatives. Absorbing dyes are disclosed in numerous disclosures and patent applications in the field, for example, Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618, all of which are incorporated herein by reference. Examples of useful absorbing dyes include, ADS-830A and ADS-1064 (both available from American Dye Source, Montreal, Canada), EC2117 (available from FEW, Wolfen, Germany), Cyasorb IR 99 and Cyasorb IR 165 (both available from Glendale Protective Technology), Epolite IV-62B and Epolite III-178 (both available from the Epoline), PINA-780 (available from the Allied Signal Corporation), SpectraIR 830A and SpectraIR 840A (both available from Spectra Colors).

The amount of photothermal conversion material in the bottom layer is generally sufficient to provide an optical density of at least 0.05, and preferably, an optical density of from about 0.5 to about 2 at the imaging wavelength. As is well known, the amount of absorber required to produce a particular optical density can be determined from the thickness of the bottom layer and the extinction coefficient of the absorber at the wavelength used for imaging using Beers law. Typically the bottom layer comprises at least about 0.1 wt % of imaging radiation absorber, and preferably from about 1 to about 30 wt % of absorber.

Overlayer

The overlayer comprises an overlayer material that reduces the alkali solubility of the phenolic resin. In one embodiment, the overlayer consists essentially of the overlayer material. The preferred overlayer materials are cationic and nonionic surfactants, especially polyethyoxylated, polypropoxylated, and poly(ethoxylated/propoxylated)

compounds. In these materials, a recurring sequence of the structural unit —($OCH_2CHR$)—, in which R is hydrogen and/or methyl, is present. The sequences are typically prepared by reaction of an alcohol, phenol, etc., with ethylene oxide, with propylene oxide, or with both ethylene oxide and propylene oxide.

Nonionic surfactants of the structure R' $(OCH_2CH_2)_n OCH_2CH_2OH$ may be used as the overlayer material. n is typically about 3 to about 50, preferably about 4 to about 20. R' may be a substituted or unsubstituted aromatic or aliphatic group. When R' is substituted or unsubstituted phenyl, it is typically phenyl substituted with an alkyl group comprising six to ten, more typically eight or nine, carbon atoms. When R' is a saturated aliphatic group, it typically contains 6 to 18 carbon atoms.

Numerous ethoxylated and propoxylated surfactants are available from various suppliers under various trade names and are described, for example, in *Industrial Chemical Thesaurus*, 2nd ed., Vol. 1 and 2, M. Ash and I. Ash, Editors, VCH Publishers, New York. The compounds and tradenames listed below are only examples of numerous compounds that are available or could be prepared. Mixtures of these compounds may also be used.

The ethoxylated alkyl phenols, especially nonyl phenol (nonyloxynols) and octyl phenol (octoxynols) ethoxylated with varying amounts of ethylene oxide, are widely available. Examples include: octoxynol-4; octoxynol-5 (TRITON® X-45, Union Carbide); octoxynol-6; octoxynol-7; octoxynol-8 (TRITON® X-1114, Union Carbide); octoxynol-9 (TRITON® X-100, Union Carbide; IGEPAL® CA-630, Rhone-Poulenc); octoxynol-10; octoxynol-11; octoxynol-12; octoxynol-13 (TRITON® X-102, Union Carbide; IGEPAL® CA-720, Rhone-Poulenc); octoxynol-20 (Synperonic OP20, ICI Americas); nonyloxynol-4 (TERGITOL® NP-4, Union Carbide); nonyloxynol-6 (TERGITOL® NP-6, Union Carbide); nonyloxynol-7; nonyloxynol-8; nonyloxynol-9 (TERGITOL® NP-9, Union Carbide); nonyloxynol-10 (TERGITOL® NP-10, Union Carbide; IGEPAL® CO-660, Rhone-Poulenc); nonyloxynol-15 (TERGITOL® N-15, Union Carbide); and nonyloxynol-20 (TERGITOL® N-20, Union Carbide). Ethoxylated derivatives of aliphatic alcohols include, for example, steareth-10 (BRIJ® 76, ICI); hexeth-4-carboxylic acid (AKYPO® LF 3H, Chem-Y GmbH); deceth-6 (TRYCOL® 5952, Henkel); laureth-4 (BRIJ® 30, ICI); laureth-5; laureth-9; laureth-10 (Dehydrol 100 Henkel); laureth-20 (MARLOWET® LMA 20, Huls); ceteth-4; ceteth-10 (MACOL® CA-10, PPG); ceteth-12; ceteth-16; and ceteth-20 (DERMALCARE® C-20, Rhone-Poulenc). Surfactants that contain ethoxylated mixtures of aliphatic alcohols are also available. Other ethoxylated compounds include, for example, ethoxylated castor oil (MARLOWET® R 11/K, Huls; etc.), ethoxylated hydrogenated castor oil (MAPEG® CO-16H, PPG; etc.), ethoxylated coconut oil (PEG-8 cocoate, Nopalcol 4-C, Henkel; PEG-15 cocoate; etc.), ethoxylated lanolin, ethoxylated tall oil, and ethoxylated tallow alcohol (talloweth-11; talloweth-20; etc.).

Polyethylene oxides of varying molecular weight are commercially available, for example as POLYOX® water-soluble polymers (Amerchol, Edison, N.J., USA) and as RITA PEOs (R.I.T.A. Corp., Woodstock, Ill., USA). Examples include: POLYOX® WSR N-60K (MW about 2,000,000); POLYOX® WSR N-750 (MW about 600,000); RITA PEO-1 (MW about 210,000); RITA PEO-2 (MW about 400,000); RITA PEO-3 (MW about 1,000,000); RITA PEO-8 (MW about 1,900,000); RITA PEO-18 (MW about 4,400,000); RITA PEO-27 (MW about 7,200,000).

Cationic surfactants may be used as the overlayer material. Examples include the water-soluble salts of the carboxylic acids, sulfate esters, and phosphate esters of the ethoxylated materials described above, i.e., water-soluble salts of compounds of the general structure:

$$R'O(CH_2CH_2O)_nCH_2X$$

in which X is —$CO_2H$, —$CH_2OSO_3H$, or —$CH_2OPO_3H_2$.

Water-soluble salts are typically ammonium, substituted ammonium, or alkali metal salts, more typically sodium salts or ethanolamine salts of these compounds. Examples include: capryleth-6 carboxylic acid (AKYPO® LF1, Chem-Y GmbH); capryleth-9 carboxylic acid (AKYPO® LF2, Chem-Y GmbH); laureth-4 carboxylic acid (AKYPO® RLM 25, Chem-Y GmbH); laureth-6 carboxylic acid; laureth-11 carboxylic acid (AKYPO® RLM 100, Chem-Y GmbH); laureth-14 carboxylic acid (AKYPO® RLM130, Chem-Y GmbH); laureth-4 phosphate (GAFAC® RD-510, Rhone-Poulenc); laureth-7 phosphate; laureth-8 phosphate; ceteth-8 phosphate (Surfagene FGZ 608, Chem-Y GmbH); deceth-4 phosphate (Monafax 831, Mona); DEA-oleth-10 phosphate (Chemphos TR-505D, Chemron); sodium laureth-8 sulfate (Texapon ASV; Henkel); sodium nonoxynol-9 phosphate (Emphpos CS-1361, Witco); sodium nonoxynol-6 sulfate (Akyposal NPS 60, Chem-Y GmbH); and sodium octoxynol-9 sulfate (Akyposal OPS 85, Chem-Y GmbH).

Water-soluble copolymers of the general structure:

$$HO(CH_2CHRO)_nCH_2X$$

in which R is H and/or $CH_3$ may be used as the overlayer material. An example is Polyglycol M41/40 (Hoechst).

Water-soluble esters of the general structure may be used as the overlayer material:

$$R''CO—(OCH_2CHR)_nOH$$

in which R" is an alkyl group of two to twenty carbon atoms, preferably eight to sixteen carbon atoms.

Examples include: PEG-6 laurate (KESSCO® PEG 300 ML, Stepan),PEG-8 laurate (MAPEG® 400 ML, PPG), PEG-8 stearate (Nopalcol 4-S Henkel), PEG-10 stearate (ETHOFAT® 60/20, Akzo), PEG-8 myristate, PEG-20 myristate, PEG-8 oleate (Nopalcol 4-0, Henkel), and PEG-12 oleate (Nopalcol 6-0, Henkel).

Other useful overlayer materials include nonionic fluorosurfactants, such as FLUORAD® FC 430, and FLUORAD® FC 431, (3M, St. Paul, Minn.) and copolymer acrylates with perfluoroalkyl and polyoxyalkyene groups (Megafac DG001 and Megafac F171, Dainippon Ink & Chemical). Polyethoxylated siloxanes, such as polyethoxylated dimethylsiloxanes (dimethicone copolymers) (DOW CORNING® 190 and 193, Dow Corning; and SILWET® L-720, L-7000, L-7500, and L-7600, Union Carbide); polyethoxylated polysiloxane copolymers, such as Byk 307, a polyethoxylated dimethylpolysiloxane copolymer (Byk-Chemie); modified polyethoxylated siloxanes, such as Edaplan LA 411, a modified polyethoxylated siloxane (M ünzing); and polyether siloxane copolymers, such as Tegoglide 265 and Tegoglide 410 (Tego Chemie Service) are also useful as overlayer materials. SURFYNOL® 440 (Air Products), an ethoxylated tetramethyldecin-4,5-diol; and Lubrimet P900 (BASF), a polypropylene oxide are also useful overlayer materials. Ethylene oxide/propylene oxide copolymers, such as PEG/PPG-17/6 copolymer (UCON® 75-H-450, Union Carbide); PEG/PPG-18/4 copolymer (UCON® 75-H-490, Union Carbide); PEG/PPG-35/9 copolymer (UCON® 75-H-1400, Union Carbide); and PEG/PPG-23/50 copolymer (UCON® 25-H-2005, Union Carbide) are also useful overlayer materials.

Cationic surfactants that may be used as the overlayer material include quaternary ammonium chlorides, such as N-cetyl-N,N,N-trimethyl ammonium chloride; N-lauryl-N,N,N-trimethyl ammonium chloride; and cetyl pyridinium chloride. An alkyl group of 10 carbon atoms to 18 carbon atoms is typically present in these compounds. Useful cationic surfactants also include quaternary ammonium salts of ethoxylated and propoxylated ethanolamines, for example, $[CH_3N\ (CH_2CH_3)_2(CH_2CHRO)_nH]^+$ CL-(EMCOL® CC-9 and EMCOL® CC-36, Witco, which R is methyl and n is about 9 and about 25, respectively).

The overlayer is applied to the precursor element, comprising the bottom layer on the hydrophilic surface of the substrate, from a solvent that does not dissolve, and preferably does not swell, the bottom layer. Therefore, the overlayer material must be soluble in a solvent that does not dissolve, and preferably does not swell, the bottom layer.

The overlayer typically has a thickness below the normal thickness of 1 to 2 microns, typically less than 0.05 micron. The overlayer is believed to have a thickness of from about a monolayer to less than about 0.03 microns, preferably less than 0.01 micron.

As will be appreciated by those skilled in the art, it may be difficult to measure directly the thickness of a layer of this thickness. However, as is well known, thickness may be calculated by other techniques, for example, from the coating weight of the layer and the density of the applied material.

Preparation of the Imageable Element

The imageable element may be prepared by sequentially applying the bottom layer over the hydrophilic surface of the hydrophilic substrate to produce a precursor element comprising the bottom layer over the support, and then applying the overlayer over the bottom layer to produce the imageable element.

The bottom layer may be applied over the hydrophilic substrate by any conventional method. Typically the ingredients are dispersed or dissolved in a suitable coating solvent and the resulting mixtures coated by conventional methods, such as spin coating, bar coating, gravure coating, or roller coating. An intermediate drying step, i.e., drying the bottom layer to remove coating solvent before applying the overlayer, may also be used to help prevent mixing of the layers.

The overlayer is applied over the bottom layer. During the application of the overlayer, it is important to avoid dissolving the bottom layer or intermixing the bottom layer and overlayer. Therefore, the overlayer should be applied from a solvent in which the bottom layer is not soluble. Preferably, the solvent should not swell the bottom layer to any appreciable degree. The term "solvent" includes mixtures of solvents.

Selection of the solvents used to coat the bottom layer and to apply the overlayer will depend on the nature of the overlayer material, the binder, and the other ingredients present in the bottom layer and the overlayer. The overlayer material and the bottom layer should not intermix when the overlayer is applied. To prevent the bottom layer from dissolving and mixing with the overlayer when the overlayer is applied over the bottom layer, the overlayer should be applied from a solvent in which the binder is essentially insoluble. Thus, the solvent for the overlayer should be a solvent in which the overlayer material is sufficiently soluble that the overlayer can be formed and in which the bottom layer essentially insoluble.

Although the solvents selected depend on the nature of the materials, typically the bottom layer will be soluble in more polar organic solvents and insoluble in less polar organic solvents and in water. Consequently, the bottom layer can typically be coated from polar organic solvent such as 2-butanone, propyleneglycol acetate, n-butanol, iso-propyl alcohol, or butyl acetate. Solvents that may be used to apply the overlayer include water and non-polar organic solvents, such as toluene, octane, and other aliphatic and aromatic hydrocarbon solvents.

The overlayer may be conveniently applied by a dip and rinse process. The precursor element comprising the bottom layer over the support is dipped in a solution of the overlayer material in a solvent in which the bottom layer is essentially insoluble, removed, rinsed, and dried to produce the imageable element. Alternatively, a solution of the overlayer material in a solvent in which the bottom layer is essentially insoluble may be applied over the bottom layer of the precursor element and dried to produce the imageable element.

Imaging

Imaging may be carried out by well-known methods. The element is "positive working" in that the exposed regions are removed to reveal the underlying hydrophilic surface of the substrate.

If the element is a conventional analog element, it may be exposed to actinic radiation from a source of light that is absorbed by the photoreactive component or components present. Conventional exposure sources include, for example, carbon arc lamps, mercury lamps, xenon lamps, tungsten lamps, metal halide lamps, and lasers emitting at the appropriate wavelength. Diazonaphthoquinone compounds substituted in the 5-position typically absorb at 350 nm and 400 nm. Diazonaphthoquinone compounds substituted in the 4-position typically absorb at 310 nm and 390 nm. Imagewise exposure is typically carried out through a photomask, but direct digital exposure with a laser emitting at the appropriate wavelength is also possible.

If the element is a thermal element that comprises a photothermal conversion material, it may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a Creo Trendsetter (available from the CREO Corp., British Columbia, Canada) and a Gerber Crescent 42T (available from the Gerber Corporation).

Alternatively, the thermally imageable element may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the element absorb infrared radiation. However, elements that absorb infrared radiation can be imaged with a thermal head.

Imaging produces an imaged element, which comprise a latent image of imaged and unimaged regions. Developing the imaged element to form a developed element converts the latent image to an image by removing the exposed regions and revealing the hydrophilic surface of the underlying substrate.

The imaged element is developed in an appropriate developer. The developer may be any liquid or solution that can penetrate and dissolve both the exposed regions without substantially affecting the complimentary unexposed regions.

Useful developers are the aqueous solutions having a pH of about 7 or above. Preferred developers are those that have a pH between about 8 and about 13.5, typically at least about 11, preferably at least about 12. Wholly aqueous developers, i.e., those that do not comprise an added organic solvent, are preferred. Useful developers for thermal printing plate precursors include commercially available developers, such as PC3000, PC9550, and PC9000, aqueous alkaline developers each available from Kodak Polychrome Graphics LLC.

Typically, the developer is applied to the imaged element by rubbing or wiping the overlayer with an applicator containing the developer. Alternatively, the imaged element may be brushed with the developer or the developer may be applied to the element by spraying the overlayer with sufficient force to remove the exposed regions. In either instance, a developed element is produced. Development may be carried out in a commercially available developer bath, such as a Mercury Processor (Kodak Polychrome Graphics).

The developed element, typically a lithographic printing member or a printing plate, comprises (1) regions in which the bottom layer and overlayer have been removed revealing the underlying surface of the hydrophilic substrate, and (2) complimentary regions in which the under layer and overlayer have not been removed. The regions in which both the bottom layer and overlayer have not been removed are ink receptive and correspond to the regions that were not exposed during imaging.

If desired, a post-development baking step can be used to increase the run length of the printing member. Baking can be carried out, for example at about 220° C. to about 240° C. for about 7 to 10 minutes.

Industrial Applicability

The imageable elements prepared by the method of the invention are useful as printing plates for offset lithography. For imaging, the imaging member can be supplied as an individual sheet (that is a printing plate) or as a continuous web that is cut at the appropriate time. The imaging member can also be configured as a printing cylinder or sleeve, or printing tape or web.

Once the imageable element has been imaged and developed, printing can then be carried out by applying a lithographic ink to the image on its surface, and then transferring the ink to a suitable receiving material (such as cloth, paper, metal, glass or plastic) either directly or indirectly through the use of an offset printing blanket to provide a desired impression of the image thereon.

The advantageous properties of this invention can be observed by reference to the following examples, which illustrate but do not limit the invention.

EXAMPLES

| Glossary | |
|---|---|
| ADS-830A | Infrared absorbing dye (λmax = 830 nm) (American Dye Source, Montreal, Canada) |
| ADS-1060 | Infrared absorbing dye (λmax = 1060 nm) (American Dye Source, Montreal, Canada) |
| AKYPO ® LF2 | Capryleth-9 carboxylic acid; $CH_3(CH_2)_7O(CH_2CH_2O)_8CH_2COOH$ (Chem-Y GmbH) |
| Byk 307 | Polyethoxylated dimethylpolysiloxane copolymer (Bky-Chemie) |
| DC 190 | Polyethoxylated siloxane (Dow Corning) |
| DOWANOL ® PM | Propylene glycol methyl ether (Dow, Midland, MI, USA) |
| Edaplan LA 411 | Modified polyethoxylated siloxane (Münzing) |
| EMCOL ® CC-9 | $[CH_3N(CH_2CH_3)_2(CH_2(CH_3)CHO)_nH^+ Cl^-]$, in which n is about 9 (Witco, Perth Amboy, NJ) |
| HO-98-34 | Novolac resin (DIC, Japan) |
| Ethyl Violet | C.I. 42600; CAS 2390-59-2 ($\lambda_{max}$ = 596 nm) $[(p-(CH_3CH_2)_2NC_6H_4)_3C^+ Cl^-]$ |
| FLUORAD ® FC430 | Nonionic fluoroalkyl surfactant (3M, St. Paul, MN, USA) |
| Lubrimet P900 | Polypropylene oxide (BASF, Ludwigshafen, Germany) |
| Megafac DG001 | Copolymer acrylates with perfluoroalkyl and polyoxyalkyene groups (Dainippon Ink & Chemical, Tokyo, Japan) |
| Megafac F171 | Copolymer acrylates with perfluoroalkyl and polyoxyalkyene groups (Dainippon Ink & Chemical, Tokyo, Japan) |
| NQD | Naphthoquinonediazide sulfonic acid ester of p-cresol novolac resin |
| PD140A | Cresol/formaldehyde novolac resin (75:25 m-cresol/p-cresol) (Borden Chemical, Columbus, OH, USA) |
| Polyglycol M41/40 | Carboxymethyl polyethylene glycol (Hoechst). |
| SURFYNOL ® 440 | Ethoxylated tetramethyldecin-4,5-diol (Air Products, Allentown, PA) |
| Triazine B | 2,4-Bis(trichloromethyl)-6-(4-methoxy-1-naphthyl)-1,3,5-triazine (Panchim, Lisses, France) |
| TRITON ® X-100 | octoxynol-9, ethoxylated alkyl phenol (Union Carbide, Danbury, CT) |

-continued

| Glossary | |
|---|---|
| Trump IR Dye | Infrared absorbing dye (λmax = 830 nm) (Eastman Kodak, Rochester, NY, USA) |

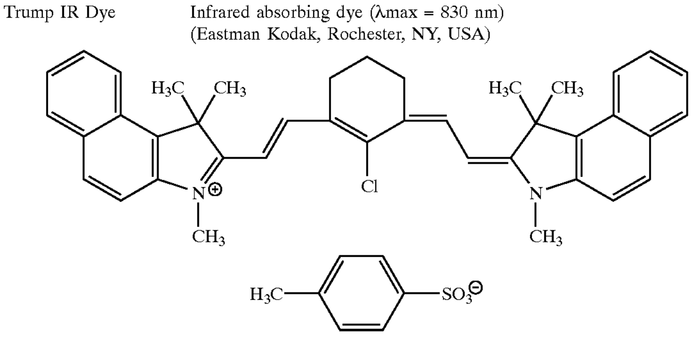

Trump IR Dye

Example 1

This example illustrates a preparation and evaluation of a positive-working analog imageable element in which the overlayer is applied from water.

A composition containing 20 wt % NQD, 78.5 wt % PD140A, 1 wt % ethyl violet, and 0.5% Triazine B dissolved in 1:3 DOWANOL® PM/tetrahydrofuran at 10% solids was prepared. It was applied to a precursor comprising the bottom layer on the support with wire bar number 3 (Erichsen) as a 24 μm wet layer onto a substrate of aluminum sheet that had been electrochemically grained to Ra 0.59, anodized, and coated with polyvinyl phosphonic acid. The precursor was dried in an oven for 5 min at 100° C. to give a bottom layer with a coating weight of 2.3 $g/m^2$.

An overlayer was deposited over the bottom layer to produce the imageable element. A 0.25 w/w % aqueous solution of FLUORAD® 430 fluorinated nonionic surfactant was applied over the bottom layer using a wire bar number 1 (wet film 6 μm) to give a uniform overlayer of about 0.01 $g/m^2$ (about 12 nm thickness) and dried at 100° C. for 2 min.

The resistance of the imageable element to developer was tested by a soak test. The test is performed as follows: Droplets of developer are placed on the unexposed element at 1 min time intervals and the developer is then wiped off after 4 min. The soak test gives the time until visible attack of the coating is observed.

A good soak test with a very aggressive developer, such as EP260 (Agfa) is an indication that the coating is resistant to most other positive developers. The soak test for the imageable element was 3 min.

The imageable element was exposed in a vacuum frame to 475 $mJ/cm^2$ of ultraviolet radiation using a conventional exposure unit. It was developed with 2000M positive developer used for conventional positive plates (Kodak Polychrome Graphics) in a cuvette at 25° C. with a 15 sec immersion followed by 5 sec wiping. The imagewise exposed regions were removed by the developer. The grayscale speed on a Stouffer step wedge was 5 clear and microlines on the UGRA showed 15μ broken.

Comparative Example 1

This example illustrates a preparation and evaluation of a positive-working analog imageable element without an overlayer.

A precursor comprising a bottom layer on a support was prepared as described in Example 1. The resistance of the precursor was tested with developer EP 260 as described in Example 1. The first visible attack occurred at about 30 sec.

The imageable element was exposed in a vacuum frame to 475 $mJ/cm^2$ of ultraviolet radiation using a conventional exposure unit. It was developed with 2000M as described in Example 1. The imagewise exposed regions were removed by the developer. The grayscale showed 5 to 6 clear and a broken 15μ line.

Example 2

This example illustrates a preparation and evaluation of a positive-working analog imageable element in which the overlayer was applied from a non-polar solvent.

A precursor comprising a bottom layer on a support was prepared as described in Example 1. An overlayer was applied over the bottom layer. A 0.0625 w/w % solution of Lubrimet P900 in toluene was applied over the bottom layer. The layer was dried with cold air to give an overlayer about 4 nm thick.

The resistance of the imageable element to positive developer was tested as described in Example 1. There was no visible attack after 4 min. No sensitivity to fingerprints was observed.

The imageable element was exposed with 475 $mJ/cm^2$ in a vacuum frame and developed as described in Example 1. The grayscale speed on a Stouffer step wedge was 5 clear and microlines on the UGRA showed 15μ broken.

Example 3

This example illustrates a preparation and evaluation of a conventional positive-working imageable element in which the overlayer is applied by a dip and rinse process.

An element comprising a bottom layer on a support was prepared as described in Example 1. An overlayer was applied over the bottom layer by immersing the element in a solution of 2% Bky 307 in a mixture of water/iso-propyl alcohol (90:10 vol %) for 10 sec at room temperature. The resulting imageable element was rinsed with water and dried with cold air.

The resistance of the imageable element to positive developer was tested as in Example 1. There was no visible attack after 4 min. No sensitivity to fingerprints was observed.

The imageable element was exposed with 475 mJ/cm$^2$ in a vacuum frame and developed as described in Example 1. The grayscale speed on a Stouffer step wedge was 5 clear and microlines on the UGRA showed 15 broken.

Example 4

This example illustrates a preparation and evaluation of a positive-working thermal imageable element in which the overlayer was applied from an aqueous solvent.

A precursor comprising a bottom layer on a support was prepared by coating a 10 w/w % solution containing 94% HO-98-34, 2% Trump IR dye, 2% tetrahydrophthalic anhydride, and 2% ethyl violet in DOWANOL® PM onto the support of Example 1 with a wire bar and dried in an oven at 100° C. for 5 min. The coating weight was 1.9 g/m$^2$.

An overlayer was applied over the bottom layer by immersing the element in a solution of 2% FLUORAD® 430 fluorinated nonionic surfactant in water for 10 sec. The resulting imageable element was rinsed with water and dried in cold air.

The resistance of the imageable element to PC9005 developer (Kodak Polychrome Graphics) was tested as described in Example 1 except that PC9005 developer was used in place of EP260 developer. There was only a slightly visible attack after 1 min, indicating that no oven conditioning is needed for sufficient resistance to PC9005 developer. No sensitivity to fingerprints was observed.

The imageable element was imaged with a Creo Trendsetter (CreoScitex) at a power setting of 10 W and a drum speed of 180 rpm and developed through a Mercury Processor (Kodak Polychrome Graphics) with PC9005 developer at 24° C. at 100 cm/min, which produces an about 27 sec dwell-time. The resulting imageable element had a strong image. When tested with a drop of ethylene glycol monomethyl ether, the non-image areas were clean.

Comparative Example 2

This example illustrates a preparation and evaluation of a thermal imageable element without an overlayer.

A precursor comprising a bottom layer on a support was prepared as described in Example 4 to give a coating weight of 2.0 g/m$^2$. The resistance of the imageable element was tested with developer 9005 as described in Example 1. After about 20 sec the entire coating had dissolved in the developer without sufficient differentiation for an image. Even after the imageable element had been conditioned in an oven for 90 min at 90° C., the entire coating dissolved in about 30 sec.

The imageable element was imaged and developed as described in Example 4. The resulting imageable element showed an entire loss of image during development. Both the image and non-image areas were tested with a drop of ethylene glycol monomethyl ether, and no coating remained in either region following development.

Example 5

This example illustrates a preparation and evaluation of a positive-working thermal imageable element in which the overlayer was applied by a dip and rinse method.

A precursor comprising a bottom layer on a support was prepared as described in Example 4. An overlayer was applied over the bottom layer by immersing the precursor in an aqueous solution of 2% of the sodium salt of AKYPO® LEF2 surfactant for 10 sec at room temperature. The resulting imageable element was rinsed with water and dried with cold air.

The resistance of the imageable element to developer was tested as in Example 1. There was no visible attack after 1 min, indicating that oven conditioning was not necessary to provide resistance to PC9005 developer. No sensitivity to fingerprints was observed. There was no visible attack after 4 min. No sensitivity to fingerprints was observed.

The imageable element was imaged and developed as described in Example 4. The resulting imageable element had a strong image. When tested with a drop of ethylene glycol monomethyl ether, the non-image areas were clean.

Example 6

This example illustrates a preparation and evaluation of a positive-working thermal imageable element by a dip and rinse method.

A precursor comprising a bottom layer on a support was prepared by coating 16 w/w % solution containing 89% PD140A, 1.5% tetrahydrophthalic anhydride, 5.5% ADS-1060, 2.0% ADS-830, and 2.0% ethyl violet in DOWANOL® PM/dioxolane/methanol (15:45:40 vol %) onto the support of Example 1.

An overlayer was applied by immersing the precursor in an aqueous solution of 2% AKYPO® LF2 (sodium salt) for 10 sec at room temperature. The resulting imageable element was rinsed with water and dried with cold air.

The imageable element was imaged with a Gerber 30301 (IR laser at 1064 nm) at 200 mJ/cm$^2$ and developed through a Mercury Processor (Kodak Polychrome Graphics) with 9005 developer at 24° C. at 80 cm/min. The image areas were not attacked, and the non-image areas were clean.

Another imageable element prepared with this overlayer was imaged with a Creo Trendsetter (CreoScitex) and developed as described in Example 4. The image was not attacked, and the non-image areas were clean.

Comparative Example 3

A precursor comprising a bottom layer on a support was prepared as described in Example 6. The resulting element was imaged with a Creo Trendsetter (CreoScitex) and developed as described in Example 4. The entire image was lost during development. Both the imaged and non-imaged areas were tested with a drop of ethylene glycol monomethyl ether, and no coating remained in either region following development.

Examples 7–12

The materials listed in Table 1 were each applied to a precursor prepared as in Example 1. The solutions were each applied using a wire bar and dried at 100° C. for 2 min.

Each imageable element was exposed in a vacuum frame to 475 mJ/cm$^2$ of ultraviolet radiation using a conventional exposure unit and developed with 2000M positive developer used for conventional positive plates (Kodak Polychrome Graphics) in a cuvette at 25° C. with a 15 sec immersion followed by 5 sec wiping. The imagewise exposed regions were removed by the developer. The grayscale speed on a Stouffer step wedge was 5 clear and microlines on the UGRA showed 15$\mu$ broken in all these example.

The results of the soak test using EP260 positive developer are given in Table 1.

TABLE 1

| Example | Substances and Solvent system | Results: soak test with EP260 |
|---|---|---|
| 7 | Megafac DG001 (0.5% in toluene) | 3 min |

TABLE 1-continued

| Example | Substances and Solvent system | Results: soak test with EP260 |
|---|---|---|
| 8 | Edaplan LA411 (0.5% in toluene) | 3 min; some coating attack in the form of pinholes arising probably due to inhomogenity of the top layer. |
| 9 | Polyglycol M41/40 (0.25% in toluene) | 4 min |
| 10 | TRITON ® X-100 (0.25% in toluene) | 4 min |
| 11 | SURFYNOL ® 440 (0.5% in toluene), | 3 min |
| 12 | EMCOL ® CC-9 (0.5% in toluene). | 4 min |

Examples 13–14

These examples illustrate a preparation and evaluation of a positive-working element in which the overlayer was applied from a polar solvent.

The materials listed in Table 2 were each applied to the precursors described in Example 1. Each solution was applied using a wire bar to give a wet film thickness of 6μ and dried at 100° C. for 2 min. Each imageable element was exposed in a vacuum frame to 475 mJ/cm$^2$ of ultraviolet radiation using a conventional exposure unit and developed with 2000M positive developer used for conventional positive plates (Kodak Polychrome Graphics) in a cuvette at 25° C. with a 15 sec immersion followed by 5 sec wiping. The imagewise exposed regions were removed by the developer. The grayscale speed on a Stouffer step wedge was 5 clear and microlines on the UGRA showed 15μ broken in all these examples. The results of the soak test with EP260 are as given in Table 2.

TABLE 2

| Example | Substance in Solvent System | Results: soak test with EP260 |
|---|---|---|
| 13 | 0.5% solution of Edaplan LA 711 in water/iso-propyl alcohol (90:10 vol %) | 2 min; poor wetting of the top layer. |
| 14 | 0.5% solution of Megafac F171 in water/iso-propyl alcohol (90:10 vol %) | 3 min |

Having described the invention, we now claim the following their equivalents.

What is claimed is:

1. A method for preparing a positive working imageable element, the imageable element comprising, in order:

a hydrophilic substrate;

a bottom layer; and an overlayer comprising an overlayer material; the method comprising:

applying the overlayer over the bottom layer of a precursor comprising the bottom layer and the hydrophilic substrate, and forming the imageable element;

in which:

the overlayer is applied from a solution of the overlayer material in a solvent;

the bottom layer comprises a positive working composition imageable by heat, by near infrared radiation, or by infrared radiation;

the positive working composition comprises a phenolic resin;

the overlayer material reduces the alkali solubility of the phenolic resin;

the bottom layer is essentially insoluble in the solvent; and the overlayer is less than about 0.03 μm thick;

in which the overlay material is:

(a) a water-soluble salt of a compound of the structure:

$$R'O(CH_2CH_2O)_nCH_2X,$$

in which X is —$CO_2H$, —$CH_2OSO_3H$, or —$CH_2OPO_3H_2$; n is about 3 to about 50; and R' is a substituted or unsubstituted aromatic or aliphatic group;

(b) a compound of the structure:

$$HO(CH_2CHRO)_nCH_2X,$$

in which R is H or $CH_3$; X is —$CO_2H$, —$CH_2OSO_3H$, or —$CH_2OPO_3H_2$; and n is about 3 to about 50; or (c) a nonionic fluorosurfactant.

2. The method of claim 1 in which the overlayer material is a water-soluble salt of a compound of the structure:

$$R'O(CH_2CH_2O)_nCH_2X,$$

in which X is —$CO_2H$, —$CH_2OSO_3H$, or —$CH_2OPO_3H_2$; n is about 3 to about 50; and R' is a substituted or unsubstituted aromatic or aliphatic group.

3. The method of claim 1 in which the overlayer material is a compound of the structure:

$$HO(CH_2CHRO)_nCH_2X,$$

in which R is H or $CH_3$; X is —$CO_2H$, —$CH_2OSO_3H$, or —$CH_2OPO_3H_2$; and n is about 3 to about 50.

4. The method of claim 1 in which the overlayer material is a nonionic fluorosurfactant.

5. The method of claim 1 in which a solution of the overlayer material is applied by coating the solution of the overlayer material in the solvent over the bottom layer.

6. The method of claim 1 in which the overlayer consists essentially of the overlayer material.

7. The method of claim 1 in which the overlayer is less than about 0.01 μm thick.

8. A method for preparing a positive working imageable element, the imageable element comprising, in order:

a hydrophilic substrate;

a bottom layer; and an overlayer comprising an overlayer material;

the method comprising:

applying the overlayer over the bottom layer of a precursor comprising the bottom layer and the hydrophilic substrate, and forming the imageable element;

in which:

the overlayer is applied from a solution of the overlayer material in a solvent;

the bottom layer comprises a positive working composition imageable by heat, by near infrared radiation, or by infrared radiation;

the positive working composition comprises a phenolic resin;

the overlayer material reduces the alkali solubility of the phenolic resin;

the bottom layer is essentially insoluble in the solvent; and the overlayer is less than about 0.03 μm thick;

in which the overlayer material is applied by dipping the precursor in the solution of the overlayer material in the solvent.

9. The method of claim 8 which the overlayer material has the structure:

$$R'(OCH_2CH_2)_nOCH_2CH_2OH,$$

in which n about 3 to about 50; and R' is a substituted or unsubstituted aromatic or aliphatic group.

10. The method of claim 9 in which R' is a phenyl group substituted with an alkyl group comprising six to ten carbon atoms.

11. The method of claim 8 in which the overlayer material is a water-soluble ester of the structure:

$$R''CO—(OCH_2CHR)_nOH,$$

in which R" is an alkyl group of two to twenty carbon atoms; R is H or $CH_3$; and n is about 3 to about 50.

12. The method of claim 8 in which the overlayer material is a polyethoxylated siloxane.

13. The method of claim 8 in which the overlayer material is a quaternary ammonium chloride.

14. The method of claim 8 in which the overlayer consists essentially of the overlayer material and the overlayer is less than about 0.01 μm thick.

15. The method claim 14 in which the overlayer material is a surfactant selected from the group consisting of: $R'(OCH_2CH_2)_nOCH_2CH_2OH$; water-soluble salts of compounds of the structure: $R'O(CH_2CH_2O)_nCH_2X$; $HO(CH_2CHRO)_nCH_2X$; water-soluble esters of the structure: $R''CO—(OCH_2CHR)_nOH$; polyethoxylated siloxanes; nonionic fluorosurfactants; polyethylene oxides; polypropylene oxides; ethylene oxide/propylene oxide copolymers; and quaternary ammonium chlorides;

in which: n about 3 to about 50; R is H or $CH_3$; R' is a substituted or unsubstituted aromatic or aliphatic group; R" is an alkyl group of two to twenty carbon atoms; and X is $—CO_2H$, $—CH_2OSO_3H$, or $—CH_2OPO_3H_2$.

16. The method of claim 8 in which the overlayer material is a polyethyoxylated, polypropoxylated, or a poly (ethoxylated/propoxylated) compound.

17. The method claim 8 in which the overlayer material is a surfactant selected from the group consisting of: $R'(OCH_2CH_2)_nOCH_2CH_2OH$; water-soluble salts of compounds of the structure: $R'O(CH_2CH_2O)_nCH_2X$; $HO(CH_2CHRO)_nCH_2X$; water-soluble esters of the structure: $R''CO—(OCH_2CHR)_nOH$; polyethoxylated siloxanes; nonionic fluorosurfactants; polyethylene oxides; polypropylene oxides; ethylene oxide/propylene oxide copolymers; and quaternary ammonium chlorides;

in which: n about 3 to about 50; R is H or $CH_3$; R' is a substituted or unsubstituted aromatic or aliphatic group; R" is an alkyl group of two to twenty carbon atoms; and X is $—CO_2H$, $—CH_2OSO_3H$, or $—CH_2OPO_3H_2$.

18. A positive working imageable element comprising, in order:

a hydrophilic substrate;

a bottom layer; and an overlayer;

in which:

the bottom layer comprises a positive working photosensitive composition;

the bottom layer comprises a positive working composition imageable by heat, by near infrared radiation, or by infrared radiation;

the positive working composition comprises a phenolic resin;

the overlayer material is soluble in a solvent in which the bottom layer is essentially insoluble; and the overlayer is less than about 0.03 μm thick;

in which the overlay material is:

(a) a water-soluble salt of a compound of the structure:

$$R'O(CH_2CH_2O)_nCH_2X,$$

in which X is $—CO_2H$, $—CH_2OSO_3H$, or $—CH_2OPO_3H_2$; n is about 3 to about 50; and R' is a substituted or unsubstituted aromatic or aliphatic group;

(b) a compound of the structure:

$$HO(CH_2CHRO)_nCH_2X,$$

in which R is H or $CH_3$; X is $—CO_2H$, $—CH_2OSO_3H$, or $—CH_2OPO_3H_2$; and n is about 3 to about 50; or (c) a nonionic fluorosurfactant.

19. The element of claim 18 in which the overlayer material is a water-soluble salt of a compound of the structure:

$$R'O(CH_2CH_2O)_nCH_2X,$$

in which X is $—CO_2H$, $—CH_2OSO_3H$, or $—CH_2OPO_3H_2$; n is about 3 to about 50; and R' is a substituted or unsubstituted aromatic or aliphatic group.

20. The element of claim 18 in which the overlayer material is a compound of the structure:

$$HO(CH_2CHRO)_nCH_2X,$$

in which R is H or $CH_3$; X is $—CO_2H$, $—CH_2OSO_3H$, or $—CH_2OPO_3H_2$; and n is about 3 to about 50.

21. The element of claim 18 in which the overlayer material is a nonionic fluorosurfactant.

22. The element of claim 18 in which the overlayer consists essentially of the overlayer material.

23. The element of claim 18 in which the overlayer is less than about 0.01 μm thick.

24. A positive working imageable element comprising, in order:

a hydrophilic substrate;

a bottom layer; and an overlayer comprising an overlayer material;

the imageable element prepared by the method comprising:

applying the overlayer over the bottom layer of a precursor comprising the bottom layer and the hydrophilic substrate, and forming the imageable element;

in which:

the overlayer is applied from a solution of the overlayer material in a solvent;

the bottom layer comprises a positive working composition imageable by heat, by near infrared radiation, or by infrared radiation;

the positive working composition comprises a phenolic resin;

the overlayer material reduces the alkali solubility of the phenolic resin;

the bottom layer is essentially insoluble in the solvent; and the overlayer is less than about 0.03 μm thick;

in which the overlay material is:

(a) a water-soluble salt of a compound of the structure:

$R'O(CH_2CH_2O)_nCH_2X$, in which X is $—CO_2H$, $—CH_2OSO_3H$, or $—CH_2OPO_3H_2$; n is about 3 to about 50; and R' is a substituted or unsubstituted aromatic or aliphatic group;

(b) a compound of the structure:

$HO(CH_2CHRO)_nCH_2X$, in which R is H or $CH_3$; X is $—CO_2H$, $—CH_2OSO_3H$, or $—CH_2OPO_3H_2$; and n is about 3 to about 50; or (c) a nonionic fluorosurfactant.

25. The element of claim 24 in which the overlayer consists essentially of the overlayer material.

26. The element of claim 24 in which a solution of the overlayer material is applied by coating the solution of the overlayer material in the solvent over the bottom layer.

27. The element of claim 24 in which the overlayer material is applied by dipping the precursor in the solution of the overlayer material in the solvent.

28. The element of claim 24 in which the overlayer is less than about 0.01 μm thick.

* * * * *

UNITED STATES PATENT AND TRADEMARK OFFICE

CERTIFICATE OF CORRECTION

PATENT NO. : 6,613,494 B2
DATED : September 2, 2003
INVENTOR(S) : Savariar-Hauck et al.

It is certified that error appears in the above-identified patent and that said Letters Patent is hereby corrected as shown below:

Column 20,
Line 8, delete "overlay" and insert therefore -- overlayer --;

Column 21,
Line 7, after "8" and before "which" insert -- in --;
Lines 12, 40 and 57, after "n" and before "about" insert -- is --;
Lines 31 and 48, after "method" and before "claim" insert -- of --;

Column 22,
Line 12, delete "overlay" and insert therefore -- overlayer --;

Column 23,
Line 8, delete "overlay" and insert therefore -- overlayer --.

Signed and Sealed this

Twenty-eighth Day of October, 2003

JAMES E. ROGAN
*Director of the United States Patent and Trademark Office*